United States Patent
Murasawa et al.

(12) 
(10) Patent No.: US 6,456,503 B1
(45) Date of Patent: Sep. 24, 2002

(54) SHIELD-CARRYING ELECTRONIC APPARATUS, AND SHIELD MEMBER

(75) Inventors: Osamu Murasawa; Kazusato Tagawa, both of Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 09/658,203

(22) Filed: Sep. 8, 2000

(30) Foreign Application Priority Data

Sep. 10, 1999 (JP) .......................................... 11-257787

(51) Int. Cl.[7] .............................. H05K 7/14; H05K 7/18
(52) U.S. Cl. ....................... 361/799; 361/800; 361/752; 439/607; 439/76.1; 439/95
(58) Field of Search ................................. 361/799, 800, 361/752, 753; 439/607, 76.1, 95

(56) References Cited

U.S. PATENT DOCUMENTS

| | | | | |
|---|---|---|---|---|
| 4,637,669 A | * | 1/1987 | Tajima | 339/14 |
| 4,780,570 A | * | 10/1988 | Chuck | 174/35 |
| 4,952,170 A | * | 8/1990 | Pritulsky | 439/509 |
| 5,207,597 A | * | 5/1993 | Kline et al. | 439/607 |
| 5,647,748 A | * | 7/1997 | Mills et al. | 439/81 |
| 6,132,253 A | * | 10/2000 | Wu | 439/607 |
| 6,264,504 B1 | * | 7/2001 | Wu | 439/607 |

FOREIGN PATENT DOCUMENTS

| | | |
|---|---|---|
| JP | 82101298 | 8/1993 |
| JP | 6-7160 | 1/1994 |
| JP | 9-45390 | 2/1997 |

* cited by examiner

*Primary Examiner*—David Martin
*Assistant Examiner*—Thanh S. Phan
(74) *Attorney, Agent, or Firm*—Katten Muchin Zavis Rosenman

(57) ABSTRACT

A shield member for an electronic apparatus comprises a contact portion that extends outwardly from the shield member. The shield member is attached to an electronic apparatus slot unit and spans between the slot unit and a radiation unit via the contact portion. The contact portion creates a grounding potential between the slot unit and the radiation member.

20 Claims, 10 Drawing Sheets

SECTIONAL VIEW TAKEN ALONG THE LINE A-A IN FIG. 5.

SHIELD-CARRYING ELECTRONIC APPARATUS, AND SHIELD MEMBER

This application claims a priority based on Japanese Patent Application No. 11-257787 filed on Sep. 10, 1999, the entire contents of which are incorporated herein by reference for all purposes.

BACKGROUND OF THE INVENTION

This invention relates to an electronic apparatus having a slot portion to which connectors etc. of peripheral machines are joined.

A housing of an electronic apparatus is provided with a shield adapted to prevent electromagnetic waves generating in an electronic circuit in the interior of the electronic apparatus from leaking to the outside. In the case of an electronic apparatus having a slot portion to which the connectors of peripheral machines are joined, a shield is also provided on the slot portion so as to prevent electromagnetic waves from leaking from an opening of the slot portion to the outside. In general, a shield for a slot portion is grounded by screwing the shield of a shield for the housing. The screwing operation serves also as screwing for fixing a slot portion body to the housing in a certain case.

SUMMARY OF THE INVENTION

As described above, a shield for a slot portion is generally grounded by screwing the shield together with a slot portion body to a housing of an electronic apparatus. In an electronic apparatus having a certain inner structure, a shield for the housing is not provided around the slot portion or a shield for the housing, even when it is provided, is not so formed that the shield for housing can be fastened by screws. In such cases, how to ground the shield for the slot portion becomes a problem.

In order to ground the shield for the slot portion by bringing the shield into electrical contact with a structure other than the shield for the housing, it is necessary that the function of the object structure with which the shield to be grounded is brought into electrical contact is not spoiled.

It is an object of the present invention to provide an electronic apparatus having a structure capable of grounding a shield for a slot portion reliably without using a screwing method.

To attain the above-mentioned object, according to the present invention, there is provided the electronic apparatus including a slot unit adapted to connect external machines thereto, a shield member provided with the slot unit, and a ground potential member, the shield member having at least one contacting portion adapted to establish contact with a ground potential member so as to obtain a grounding potential therefrom.

DESCRIPTION OF THE PREFERRED EMBODIMENTS

An embodiment of the present invention will now be described with reference to the drawings. In the following embodiment, an entertainment system, being an electronic apparatus will be described.

Figure 7:
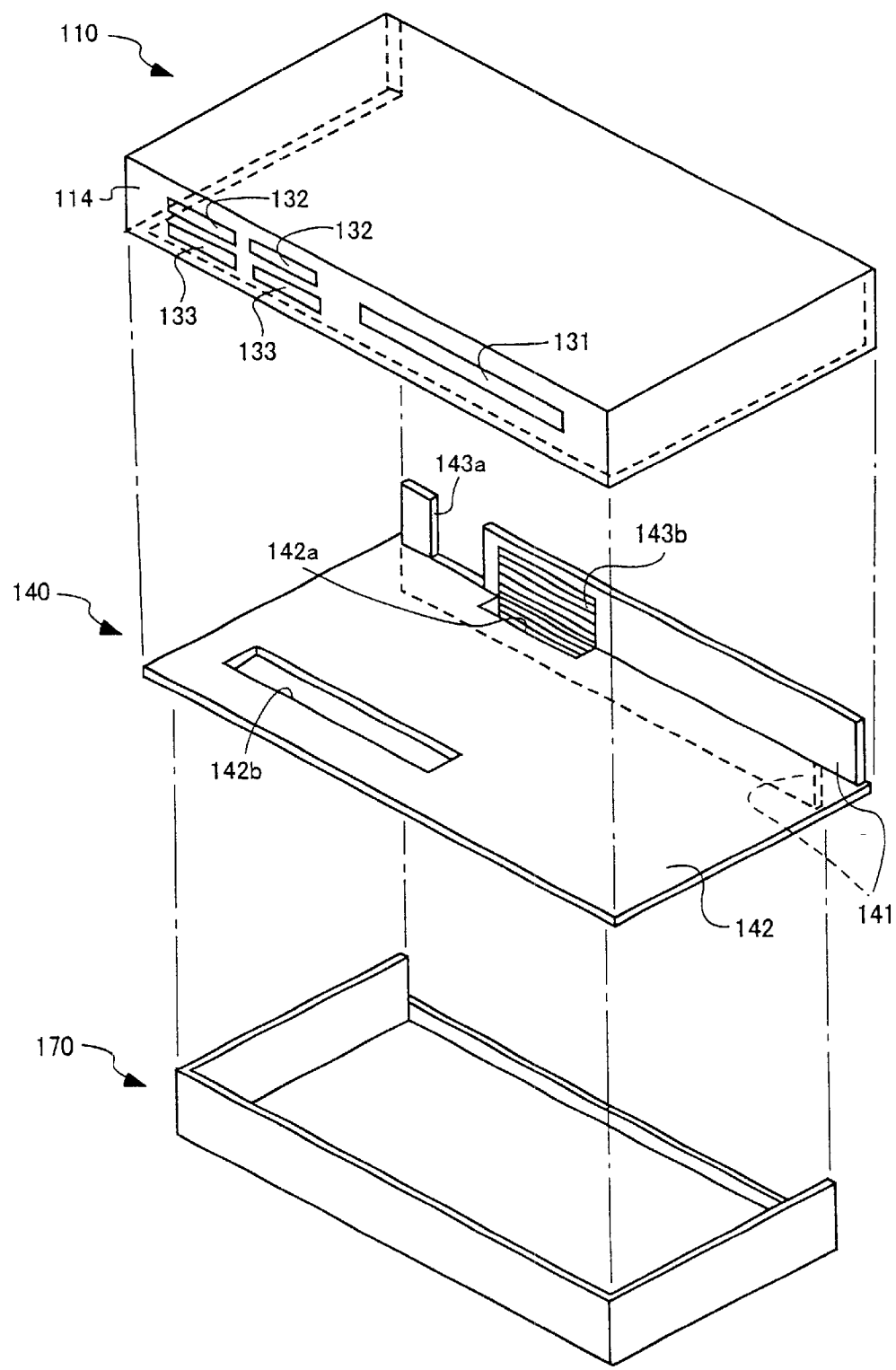
FIG. 7 illustrates an explanatory view of the shapes of three constituent members of the housing 100 of the entertainment system according to an embodiment of the present invention.

A housing 100 of embodiment of the entertainment system includes three parts as shown in FIG. 7. Namely, the housing 100 is formed of an upper housing member 110, an intermediate chassis 140 and a lower housing member 170. Both of the upper and lower housing members 110, 170 have a substantially flat, rectangular parallelopipedal shape. The upper housing member 110, intermediate chassis 140 and lower housing member 170 are fixed to one another by bolts (not shown) and thereby integrated.

Figure 8:
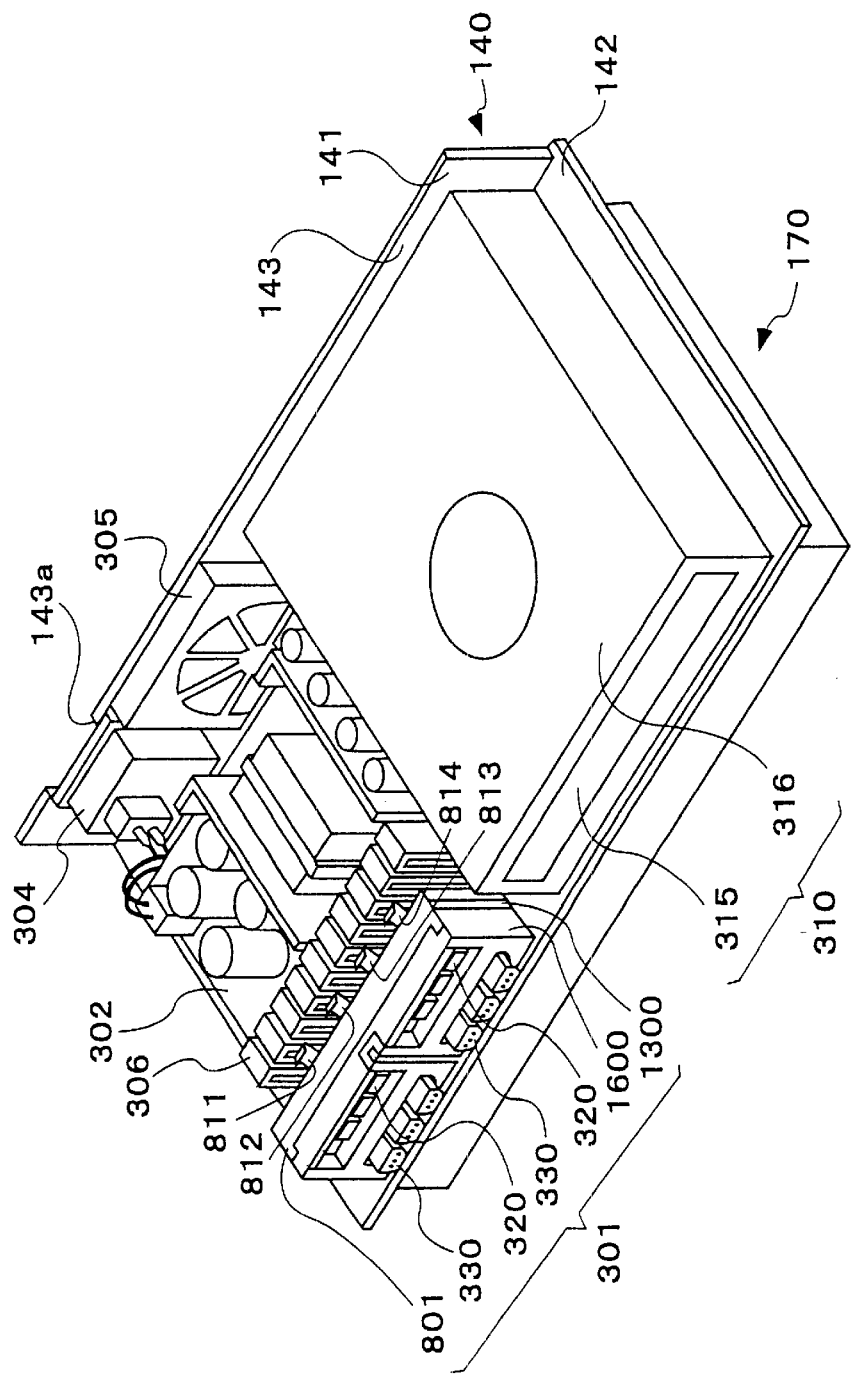
FIG. 8 is a perspective view showing the entertainment system according to an embodiment of the present invention with an upper portion of the housing 100 taken away.

The intermediate chassis 140 is provided with a rear wall portion 141, and a floor portion 142. This floor portion 142 divides an inner space of the housing 100 into a storage space on the side of the upper housing member 110, and a storage space on the side of the lower housing member 170. The floor portion 142 is mounted with various kinds of machines housed in the upper housing member 110. The machines mounted on the floor portion 142 are, for example, a disk unit 310, a slot unit 301, a power source unit 302, and a switch inlet unit 304 as shown in FIG. 8. The floor portion 142 is provided with a through hole 142b (refer to FIG. 7). Radiation fins 306 (refer to FIG. 8) set on the lower housing member 170 extend through the through hole 142b and project into the storage space on the side of the upper housing member 110. The floor portion 142 is further provided with a nick 142a, in which an exhaust fan 305 is provided.

Figure 1:
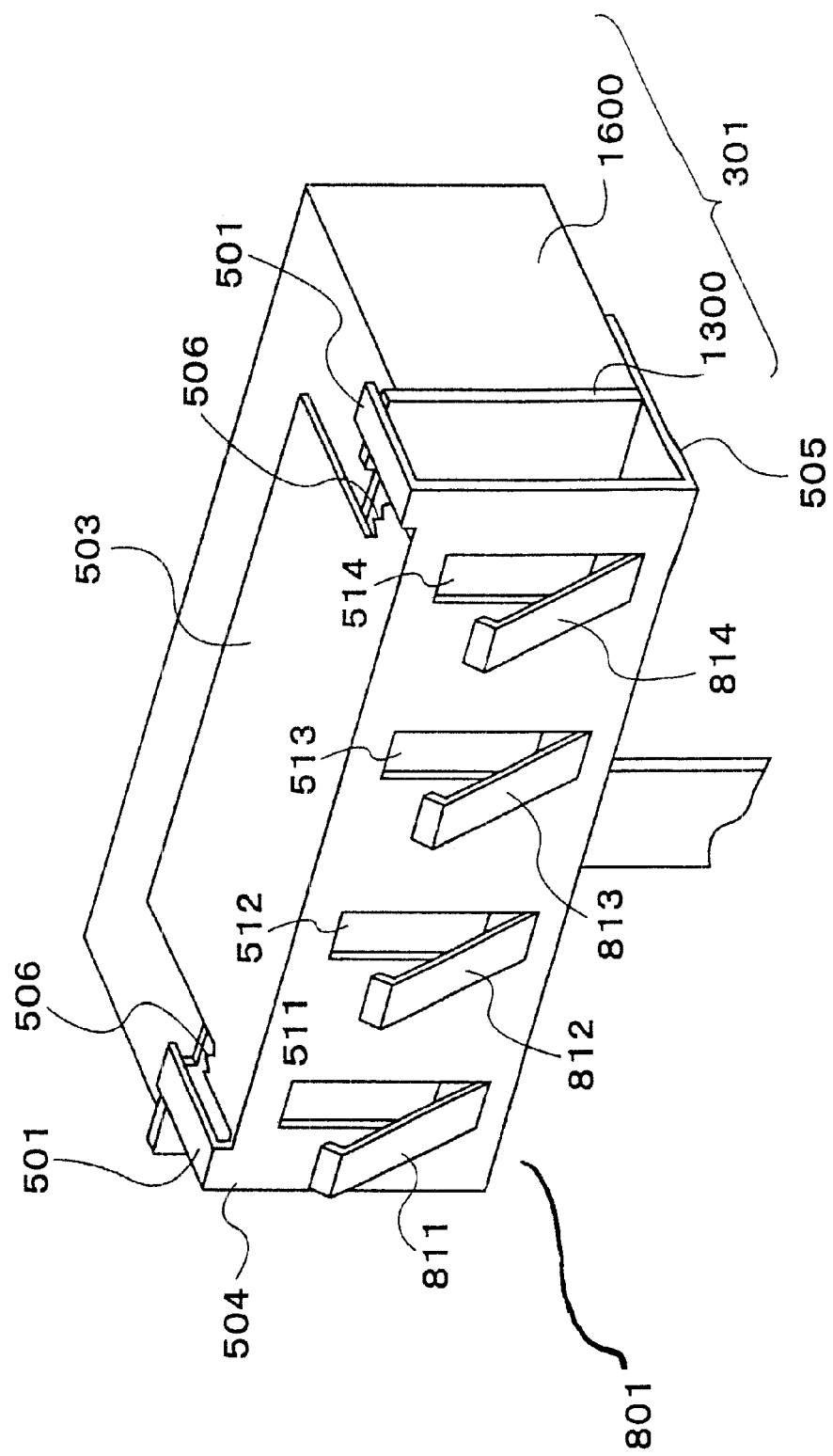
FIG. 1 is a perspective view showing an external appearance of a shield 801 fixed to a slot unit 301 according to an embodiment of the present invention.

The slot unit 301 is screwed on a projection provided on an upper surface of the floor portion 142 and thereby fixed to the floor portion 142. A shield 801 is fitted to a rear surface of the slot unit 301. The shield 801 is provided with spring members 811, 812, 813, 814 supported in a cantilevered manner at their respective lower ends as shown in FIG. 1. The spring members 811–814 are bent in the doglegged shape at a free end portion of each thereof. The free end portions of the spring members 811, 812, 813, 814 are pressed against the radiation fins 306, i.e., brought into electrical contact therewith. Thus, the shield 301 obtains a grounding potential from the radiation fins 306. Since this structure is the most characteristic part of the embodiment, a detailed description thereof will be given later.

The disk unit 310 is a recording medium driving unit for carrying out the reproduction of a disk type recording medium, such as a CD and a DVD, and has a tray 315 which is capable of projecting and retracting and a unit body 316. The tray is mounts thereon a disk type recording medium. The disk unit body 316 holds therein a reproducing unit that retracts the tray 315 and reproduces a disk, such as a CD and a DVD placed in the tray 315.

Figure 9:
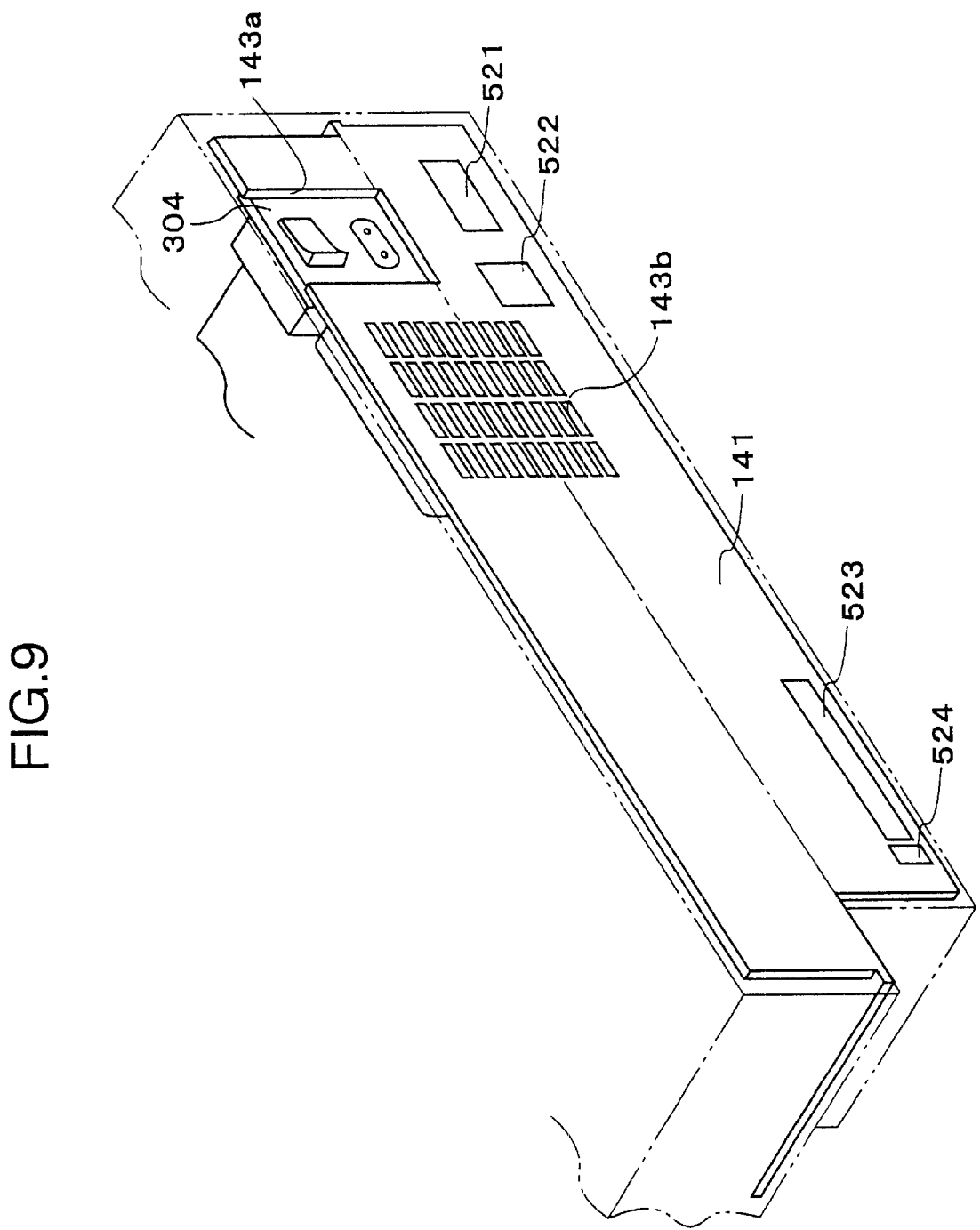
FIG. 9 is a perspective view showing a rear surface of the housing 100 of the entertainment system according to an embodiment of the present invention.

The rear wall portion 141 of the intermediate chassis 140 is provided with a nick 143*a* as shown in FIG. 9. The switch inlet unit 304 is exposed to the outside from this nick 143*a*. The rear wall portion 141 is provided with an exhaust hole 143*b* at a position opposed to the exhaust fan 305. A lower rear wall member 144 is provided with various kinds of communication terminals 521*a*, 521*b*, a card inserting slot 521*c* and a slot operating switch 524 as shown in FIG. 9.

Figure 3:
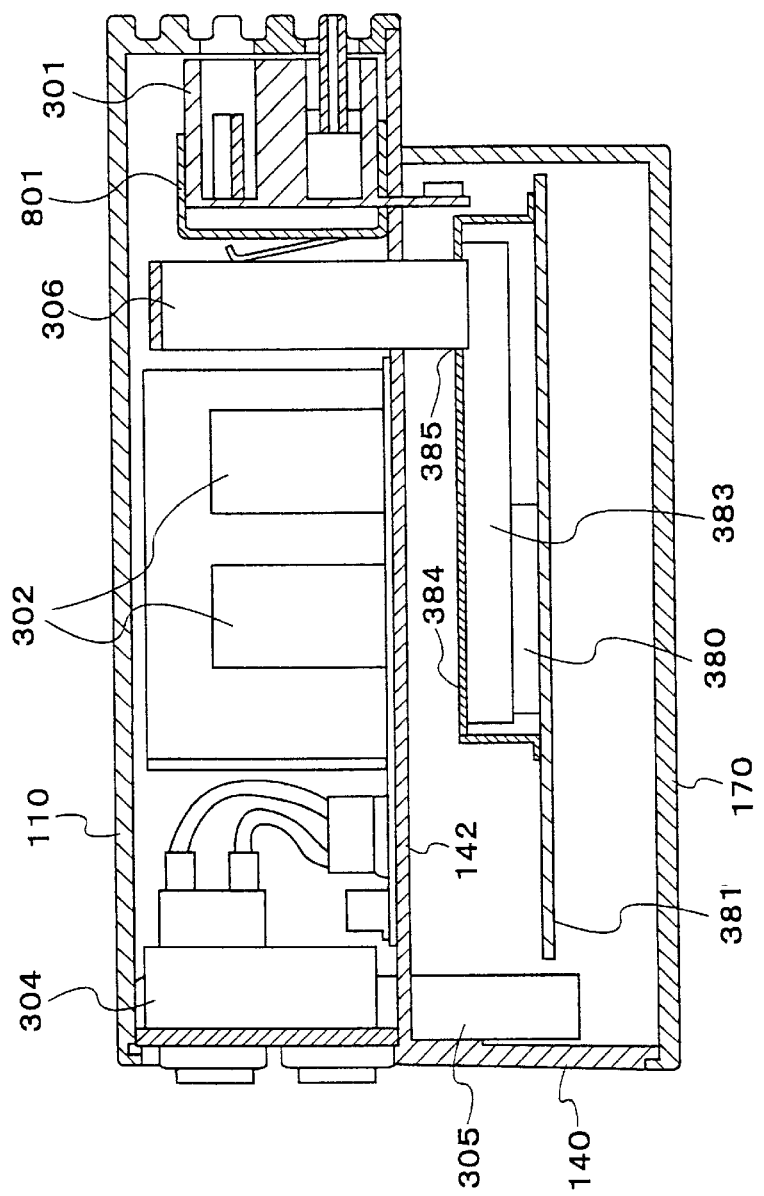
FIG. 3 is a sectional view showing the general construction of the entertainment system according to an embodiment of the present invention.
Figure 4:
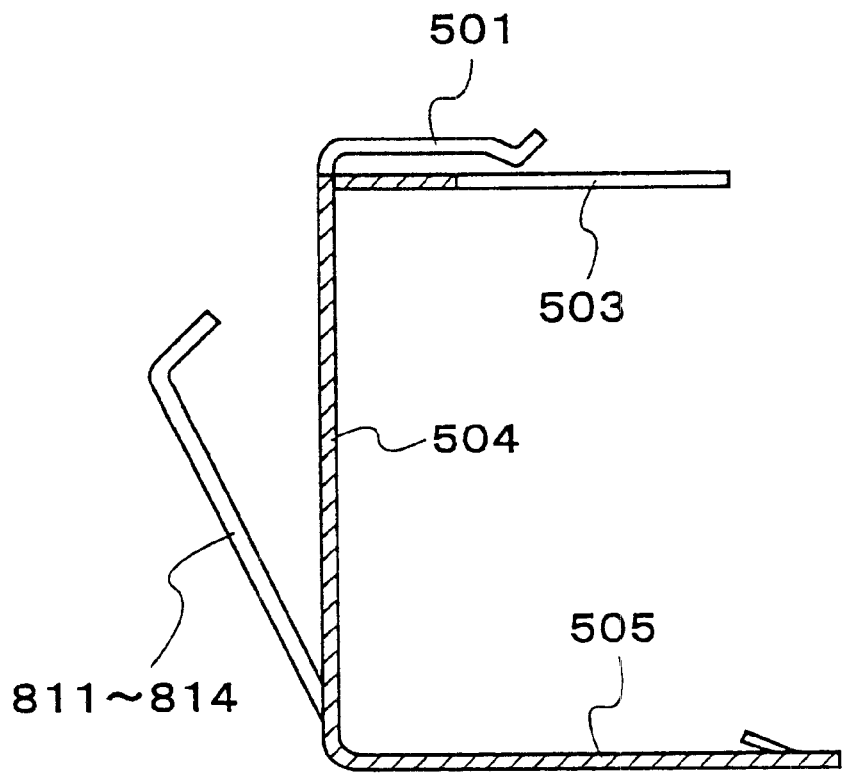
FIG. 4 is a sectional view of the shield according to an embodiment of the present invention.

The lower housing 170 is provided therein with a main board 381 having a CPU 380 mounted thereon as shown in FIG. 3. A metal pipe type heat sink 383 is fixed on an upper surface of the CPU 380 with an adhesive. The CPU 380 and the pipe type heat sink 383 are covered with a shield 384 made of a metal plate. The shield 384 is provided with an opening 385, in which the radiation fins 306 are inserted and fixed to an upper surface of the pipe type heat sink 384. The shield 384, the pipe-type heat sink 383 and the radiation fins 306 electrically contact to each other, and have a equal grounding potential to each other.

Figure 2:
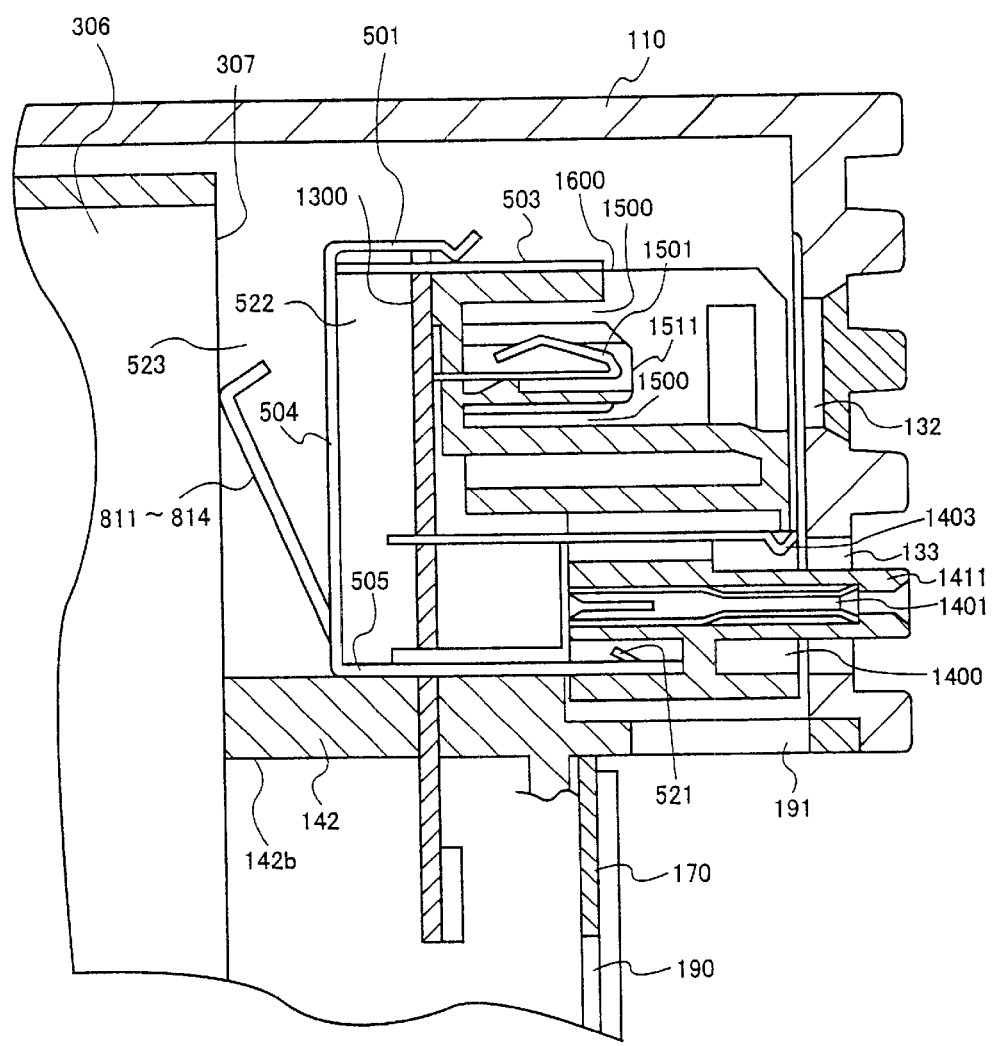
FIG. 2 is a partial sectional view of a slot unit 301 and a shield 801 of an entertainment system according to an embodiment of the present invention.
Figure 6:
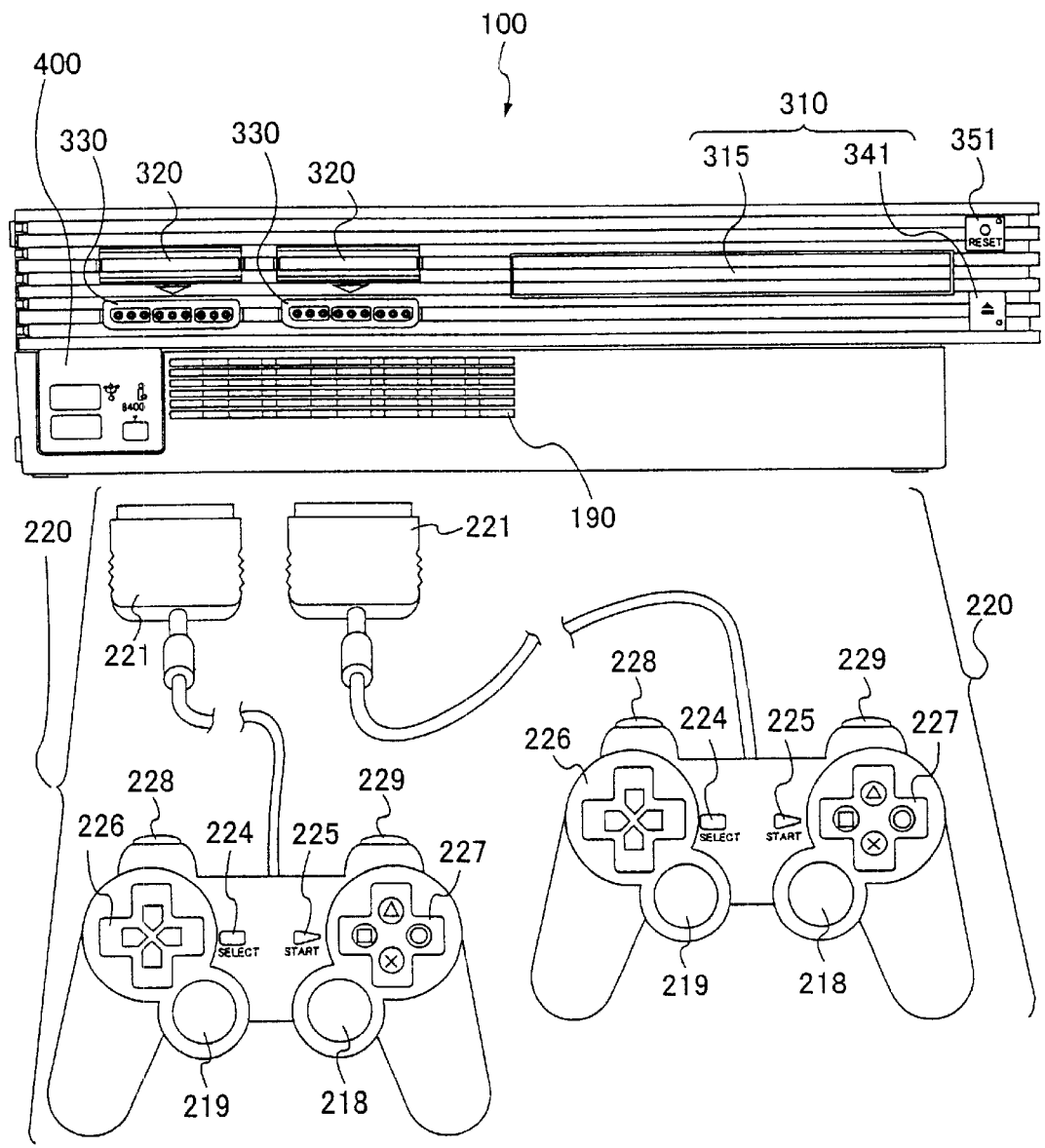
FIG. 6 is a front view of a housing of the entertainment system according to an embodiment of the present invention, and a top view of an operating devices 220.

The lower housing member 170 is provided with a vent hole 190 as shown in FIG. 6 which constitutes an intake port for the outside air, i.e. a flow of the air generated by the exhaust fan 305. As shown in FIG. 2, the floor portion 142 at a lower section of the slot unit 301 is also provided with a vent hole 191. The lower housing 170 is also provided with a connector unit 400 as shown in FIG. 6, for joining connectors thereto.

A front wall 114 of the upper housing member 110 is provided which four openings 132, 133 at a position corresponding to the slot unit 301 (FIG. 7) for forming parts receiving portions 320, 330. The front wall 114 is also provided with an opening 131 for the disk unit 310. The front wall 114 of the upper housing 110 is provided with a projected switch 341 for the disk unit 310, and a reset switch 351 (FIG. 6) in addition to these parts.

Next, the construction of the slot unit 301 and its shield 801 will be described in detail.

As shown in FIGS. 1, 2 and 8, the slot unit 301 has a unit body 1600 and a circuit board 1300. The unit body 1600 is provided with two memory device receiving portions 320 and two operating device receiving portions 330. The memory device receiving portions 320 are arranged laterally, and the operating device receiving portions 330 are arranged thereunder. The operating device receiving portions 330 are adapted to hold connectors 221 of the operating devices 220 of FIG. 6 and establish the electrical connection therewith. The memory device receiving portions 320 are adapted to hold card type external memories for storing information, such as the progress of the game played and establish the electrical connection therewith.

Figure 10:
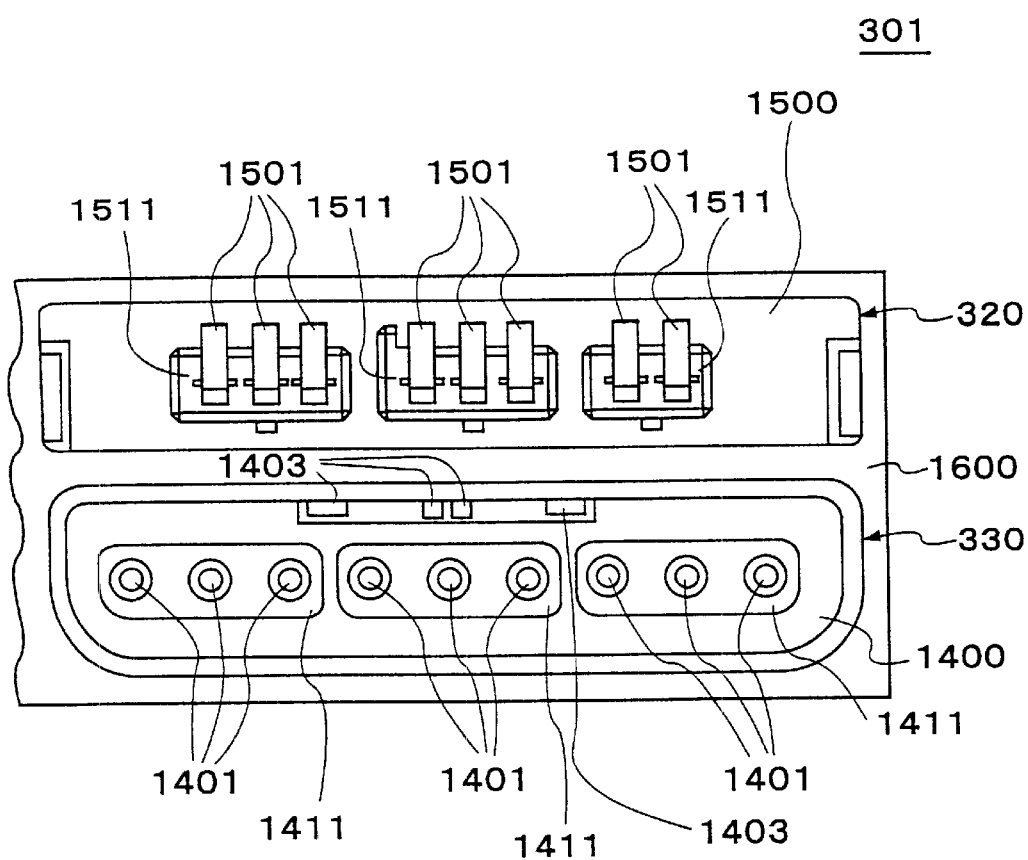
FIG. 10 is a front view showing an inner construction of the slot unit 301 of the entertainment system according to an embodiment of the present invention.

Specifically, each of the memory device receiving portions 320 is provided with an opening 1500 made in the unit body 1600, three base seats 1511 formed in the opening 1500, and terminals 1501 fixed to the base seats 1511 as shown in FIGS. 2 and 10. The terminals 1501 are connected to wiring on the circuit board 1300. Each of the operating device receiving portions 330 is provided with an opening 1400, three base seats 1411 projecting from the opening 1400, and cylindrical terminals 1401 set in inner portions of the base seats 1411. The opening 1400 is also provided at an upper portion thereof with three metal retainers 1403, some of which serve also as electric terminals. The cylindrical terminals 1401 and metal retainers 1403 are connected to the wiring of the circuit board 1300.

The shield 801 is provided on a rear surface of the slot unit 301 as shown in FIGS. 1 and 2. The shield works to prevent the electromagnetic waves occurring in the housing 100 from leaking to the outside, and the electrostatic noise occurring in the vicinity of a connector 221 of an operating device 220 from exerting influence upon the CPU 380 in the housing 100. As shown in FIGS. 1, 2, 4, 5A, 5B and 5C, the shield 801 is formed by bending a phosphor bronze plate to a three-sided angular shape, and has a top plate 503, a front plate 504 and a bottom plate 505.

Figure 5A:
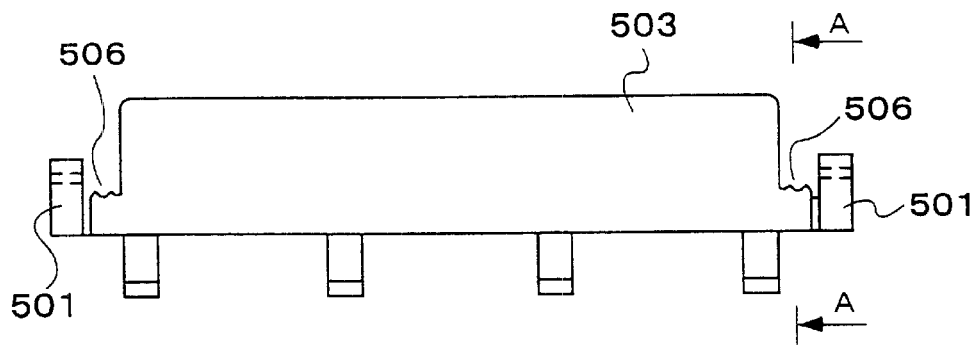
FIG. 5A is a top view of the shield according to an embodiment of the present invention.

As shown in FIGS. 1 and 5A, the top plate 503 is provided at both sides thereof with locking portions 501 which are engaged with upper portions of the circuit board 1300 as shown in FIG. 2, so as to fix the shield 801 to the slot unit 301. The top plate 503 is also provided with projections 506 which are in pressure contact with a grounding wiring pad on the circuit board 1300. Free ends of the projections 506 are sharpened, and capable of breaking through a flux layer and an oxide film of the grounding wiring pad and thereby contacting with the same pad with a low impedance.

Figure 5B:
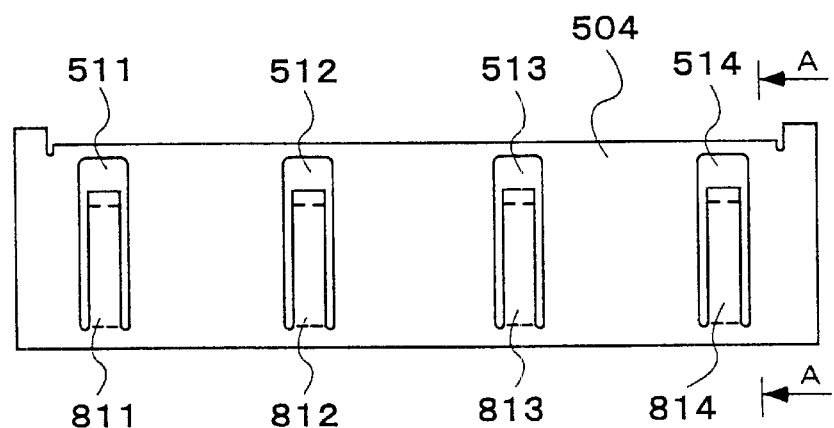
FIG. 5B is a front view of the shield according to an embodiment of the present invention.

The front plate 504 is provided with four slits 511–514 as shown in FIGS. 1 and 5B. Metal plate in the slits are cut and raised at a certain angle and cantilevered, whereby four spring members 811–814 are formed. Free end portions of the spring members 811–814 are bent in the doglegged shape.

Figure 5C:
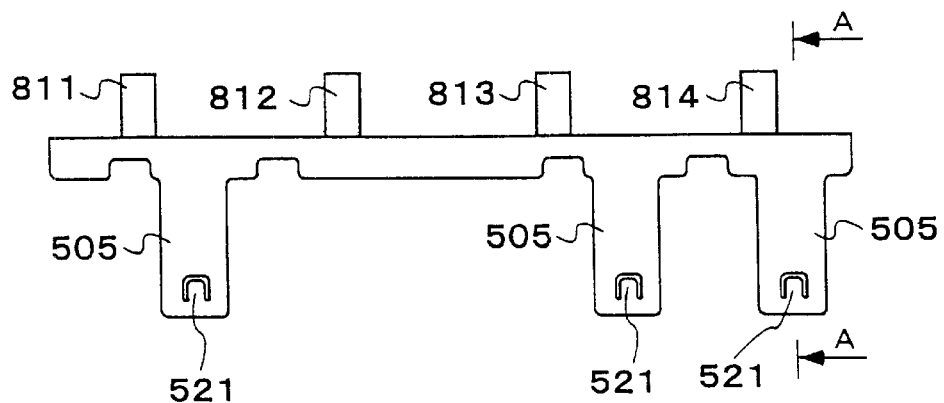
FIG. 5C is a bottom view of the shield according to an embodiment of the present invention.

The bottom plate 505 is formed like three teeth of a comb as shown in FIG. 5C. Free end portions of the comb teeth are provided with non-slip projections 521.

The top and bottom plates 503, 505 respectively contact with top and bottom surfaces respectively of the unit body 1600. The front plate 504 is opposed to the circuit board 1300 via a clearance 522.

The free end portions of the spring members 811–814 of the front plate 504 are pressed against end surfaces 307 of the radiation fins 306, whereby the spring members electrically contact with the radiation fins.

The shield 801 obtains a grounding potential by pressing the spring members 811–814 against the radiation fins 306. Since the projections 506 of the shield 801 are pressed against the grounding wiring pad on the circuit board 1300, the radiation fins 306, the shield 801 and the grounding wiring of the circuit board 1300 come to have a grounding potential respectively. This enables the shield 801 to function as an electromagnetic shield and an electrostatic shield.

The shield 801 in this embodiment serves the purpose by merely bringing the spring members 811–814 into contact with object members (the radiation fins 306 in this embodiment) of a grounding potential. Accordingly, it is unnecessary that the spring members be screwed on the object members for the purpose of obtaining a grounding potential. Thus, a grounding potential can be obtained by merely bringing the spring members into contact with the object members (the radiation fins 306), irrespective of the strength of the spring members and irrespective of whether the spring members are structurally screw-fixable or not.

This enables a range of selection of object members for obtaining a grounding potential to expand. In this embodiment, the radiation fins 306 are selected as the object members which the spring members contact. Since the air is supplied from the front vent holes 190, 191 toward the exhaust fan 305, the radiation fins 306 are disposed perpendicularly to the shield 801. Therefore, end surfaces of a small area of the radiation fins 306 are opposed to the spring members 811–814. The spring members cannot be screwed on the end surfaces of a small area of the radiation fins 306. However, the spring members 811–814 in this mode of embodiment may have only to be brought into contact with the radiation fins 306, so that a grounding potential can be obtained without any trouble from the radiation fins 306.

A contact surface area between the spring members 811–814 and object members is smaller than that between screws and object members in the case of a screw-fixed structure. Therefore, the quantity of heat transmitted from the object members to the slot unit via the spring members 811–814 becomes small. Accordingly, even the members the temperature of which becomes high, such as the radiation fins 306 does not transmit such a large quantity of heat that exerts influence upon the slot unit 301 in the structure of the shield 801. Moreover, since the spring members 811–814 are cut and raised from the front plate 504 at a certain angle, the clearance 523 is provided between the front plate 504 and heat sink 307. A clearance 522 is also provided between the front plate 504 and circuit board 1300, and the clearances 522, 523 communicate with on another via the slits 511–514 of the front plate 504. Accordingly, a flow of the air from the front vent holes 190, 191 toward the exhaust fan 305 passes through the clearances 522, 523 and slits 511–514. This enables the quantity of heat of the radiation fins 306 transmitted to the circuit board 1300 and unit body 1600 to be minimized. At the same time, the shield 801 does not prevent the radiation of heat of the radiation fins 306.

Since the free end portions of the spring members 811–814 are bent in the shape of a hook, the angular portions thereof which contact the radiation fins 306 are round and smooth. Therefore, when the radiation fins 306 are put into the opening 142b of the floor portion 142, to which the slot unit 301 is fixed, during the assembling work of the housing 100, the insertion of the radiation fins 306 can be done smoothly as the end portions thereof are kept in contact with the spring members 811–814. Since the radiation fins 306 may have only to be inserted in this manner into the opening 142b, and do not require to be screw-fixed, a screw-fixing operation for attaining the electrical contact of parts becomes unnecessary, and the assembling of the housing can be done simply. Owing to the insertion of the radiation fins 306, the spring members 811–814 receive a force by which the shield 801 is urged toward the circuit board 1300. Consequently, the projections 506 of the shield 801 are pressed against the grounding wiring pad of the circuit board 1300, and the free ends of the projections 506 break through the flux layer and the oxide layer on a surface portion of the grounding wiring pad to be connected to the grounding wiring pad with a low impedance.

The spring members 811–814 of the shield 801 can be designed so that the intervals thereof are at a desired level in accordance with a wavelength of the electromagnetic waves which are desired to be effectively screened. Accordingly, the number of the spring members 811–814 is not limited to four. The intervals of the spring members can be reduced by increasing the number of the spring members, and increased by reducing the number thereof.

When there is a scatter of the electric potential of the object members (end surfaces of the radiation fins 306) which the spring members contact, a spring member contacting an object member of a non-desired electric potential can be removed by breaking off the same, or such a spring member can be left not cut and raised from the first, so as to bring the spring members into contact with only the portions of a desired electric potential. In this case, a spring member which is not to be brought into contact with an object member can be decided by examining the distribution of electric potential of the radiation fins in each apparatus. Therefore, the spring members can be brought into contact with the portions of a desired electric potential reliably in each apparatus.

When the user plays a game with the entertainment system according to the embodiment, an external display is joined to the connecting portion 521 of the housing 100, and the connector 221 of the operating device 220 is joined to the receiving portion 330. The power source of the switch inlet unit 304 is then turned on, and an optical disk is loaded into the tray 315 of the disk unit 311. Consequently, the CPU 380 in the housing 100-receives a game program and image information etc., which are recorded in the optical disk from the disk unit 311, and shows an image on the external display. The CPU 380 communicates with the operating device 220, and receives the details of the user's operation namely how the switches 219, 218, 224–229 were operated by the user. The CPU 380 executes the game program in accordance with the details of the user's operation received, to vary the image displayed. When a card type memory device is held in the receiving portion 320, the CPU 380 communicates with the card type memory device to read the game information stored therein, and reflect the information upon the execution of the game program. In accordance with the game program, the game information is stored in the card type memory device.

Due to such operations of the CPU 380, heat generates therein, which is transmitted to the pipe type heat sink 383 and then to the radiation fins 306. While the air taken in from the vent holes 190, 191 flows toward the exhaust fan 305, it passes spaces among the radiation fins 306 to remove the heat thereof. Owing to this operation, the heat of the CPU 380 is discharged from the exhaust fan 305 to the outside. The shield 801 contacts the radiation fins 306 but the contacting surface area therebetween is small as mentioned above. Moreover, the air flows through the clearance 523 between the shield 801 and radiation fins 306, so that the heat of the radiation fins 306 is not substantially transmitted to the slot unit 301.

Since the spring members 811–814 of the shield 801 contact the radiation fins 306 as described above, the shield 801 obtains a grounding potential from the radiation fins 306, and works as an electromagnetic shield and an electrostatic shield. This prevents the electromagnetic waves in an inner portion of the housing 100 from leaking from the slot unit 301 to the outside. It is also possible to prevent the electrostatic noise occurring in the vicinity of the connector 221 from exerting an ill influence upon the CPU 380. The electric potential of the grounding wiring on the electric circuit 1300 also becomes equal to that of the shield 801.

In the above-described mode of embodiment, the spring members 811–814 of the shield 801 are projected rearward, and brought into contact with the radiation fins 306 to obtain a grounding potential. When the object members from which a grounding potential is obtained are positioned on an upper or side surfaces of the slot unit 301, the spring members 811–814 can be cut, raised and projected toward the object members.

In this embodiment, parts of the metal plate forming the shield 801 are cut and raised to form the spring members 811–814. It is also possible to prepare spring-like metal members separately from the metal plate of the shield 801, and fix these metal members to the metal plate of the shield 801.

The free end portions of the spring members 811–814 may not necessarily bent in the shape of a hook. The free end portions can be sharpened as those of the projections 506 so that the spring members can break through the oxide films in the surface portions of the object members (radiation fins 306) and thereby contact the same.

Furthermore, in this embodiment, the CPU 380 is disposed in a position in which the quantity of the electromagnetic waves leaking from the side surfaces of the slot unit 301 is small. Accordingly, the shield 801 does not cover the side surfaces of the slot unit 301. The shield can, of course, be formed so as to cover the side surfaces as well of the slot unit.

The present invention can provide an electronic apparatus of a structure capable of grounding the shield of the slot unit reliably without using a screwing method.

What is claimed is:

1. A shield member for use in an electronic apparatus equipped with a circuit board and a radiation unit, said shield member comprising:

a front plate, a bottom plate and a top plate;

said bottom plate further comprising support means for attaching said shield member to an electronic apparatus;

a contacting portion cut from and extending outwardly at an angle from said front plate such that a slit is defined in said front plate; said contacting portion being extended from one end of said slit;

locking portions provided on said top plate for engaging said shield member with an electronic apparatus circuit board; and means for providing a clearance between said shield member and an electronic apparatus circuit board during engagement of said shield member and an electronic apparatus circuit board;

wherein said contacting portion is adapted to contact a radiation unit and create a grounding potential between said radiation unit and said shield member.

2. A shield member in accordance with claim 1, wherein said contacting portion further comprises a bent free end.

3. A shield member in accordance with claim 1, further comprising a plurality of contacting portions spaced apart at predetermined intervals.

4. A shield member in accordance with claim 1, further comprising projections that are adapted to contact grounding means provided on an electronic apparatus circuit board.

5. A shield member in accordance with claim 4, wherein said projections are sharpened to enhance contact with grounding means provided on an electronic apparatus circuit board.

6. An electronic apparatus comprising:

a circuit board;

a radiation unit connected to said circuit board;

a slot unit connected to said circuit board and spaced from said radiation unit;

a shield member attached to said slot unit such that said shield member is disposed between said slot unit and said radiation member, said shield member further comprising a front plate, a bottom plate and a top plate;

said bottom plate further comprising support means for attaching said shield member to said slot unit;

a contacting portion cut from and extending outwardly at an angle from said front plate such that a slit is defined in said front plate; said contacting portion being extended from one end of said slit;

locking portions provided on said top plate for engaging said shield member with said circuit board; and means for providing a first clearance between said shield member and said circuit board during engagement of said shield member with said circuit board;

wherein said contacting portion is adapted to contact said radiation unit and create a grounding potential between said radiation unit and said shield member.

7. An electronic apparatus comprising:

a circuit board;

a radiation unit connected to said circuit board;

a slot unit connected to said circuit board and spaced from said radiation unit;

said slot unit sandwiched in a shield member, said shield member disposed between said slot unit and said radiation member and further comprising a front plate;

a contacting portion cut from and extending outwardly at an angle from said front plate such that a slit is defined in said front plate; said contacting portion being extended from one end of said slit;

wherein said contacting portion is adapted to contact said radiation unit and create a grounding potential between said radiation unit and said shield member.

8. An electronic apparatus in accordance with claim 7, further comprising projections provided on said shield member that are adapted to contact grounding means provided on said circuit board.

9. An electronic apparatus in accordance with claim 8, wherein said projections are sharpened.

10. An electronic apparatus in accordance with claim 7, wherein said radiation unit is a heat radiation unit.

11. An electronic apparatus in accordance with claim 10, wherein said contacting portion further comprises a bent free end.

12. An electronic apparatus in accordance with claim 11, wherein said bent free end is sized to minimize heat transmission between said heat radiation unit and said shield member.

13. An electronic apparatus in accordance with claim 12, wherein said slit further defines a heat passage for transmission of heat from said heat radiation unit through said shield member and through said slot unit.

14. An electronic apparatus in accordance with claim 7, wherein said contacting portion further comprises a bent free end.

15. An electronic apparatus in accordance with claim 7, further comprising:

means for providing a first clearance between said shield member and said circuit board during engagement of said shield member with said circuit board;

wherein said contacting portion defines a second clearance between said radiation unit and said front plate of said shield member.

16. An electronic apparatus in accordance with claim 15, wherein said first and second clearances communicate via said slit.

17. An electronic apparatus in accordance with claim 7, further comprising a plurality of contacting portions spaced apart at predetermined intervals.

18. An electronic apparatus in accordance with claim 7, wherein said shield member further comprises a bottom plate and said bottom plate further comprises support means for attaching said shield member to said slot unit.

19. An electronic apparatus in accordance with claim 7, wherein said shield member further comprises a top plate and locking portions provided on said top plate for engaging said shield member with said circuit board.

20. An electronic apparatus in accordance with claim 7, further comprising means for providing a first clearance between said shield member and said circuit board during engagement of said shield member with said circuit board.

* * * * *